US007419572B2

United States Patent
Komatsu et al.

(10) Patent No.: US 7,419,572 B2
(45) Date of Patent: Sep. 2, 2008

(54) SP3 BOND BORON NITRIDE EMITTING LIGHT IN ULTRAVIOLET REGION, ITS PRODUCING METHOD, AND FUNCTIONAL MATERIAL USING SAME

(75) Inventors: Shojiro Komatsu, Tsukuba (JP); Katsuyuki Okada, Tsukuba (JP); Yusuke Moriyoshi, Koganei (JP)

(73) Assignee: National Institute For Materials Science, Tsukuba-shi (JP)

( * ) Notice: Subject to any disclaimer, the term of this patent is extended or adjusted under 35 U.S.C. 154(b) by 504 days.

(21) Appl. No.: 10/518,644

(22) PCT Filed: Jul. 1, 2003

(86) PCT No.: PCT/JP03/08370

§ 371 (c)(1), (2), (4) Date: Dec. 20, 2004

(87) PCT Pub. No.: WO2004/005186

PCT Pub. Date: Jan. 15, 2004

(65) Prior Publication Data

US 2006/0163527 A1 Jul. 27, 2006

(30) Foreign Application Priority Data

Jul. 2, 2002 (JP) .............................. 2002-192863

(51) Int. Cl.
*B01J 19/08* (2006.01)
*B01J 19/12* (2006.01)
*C01B 21/064* (2006.01)

(52) U.S. Cl. ........................... 204/157.41; 204/157.45; 423/290

(58) Field of Classification Search ............ 204/157.41, 204/157.45; 423/290
See application file for complete search history.

(56) References Cited

U.S. PATENT DOCUMENTS 4,435,445 A * 3/1984 Allred et al. ................. 427/583
5,080,753 A * 1/1992 Doll et al. .................... 117/108
5,286,533 A 2/1994 Komatsu et al.

FOREIGN PATENT DOCUMENTS

| JP | 3-79770 | 4/1991 |
|---|---|---|
| JP | 5-4808 | 1/1993 |
| JP | 10-7409 | * 1/1998 |

OTHER PUBLICATIONS

Shojiro Komatsu et al, New Phase of sp -Bonded BN: The 5H Polytype, The Journal of Physical Chemistry B, vol. 103, No. 17, Apr. 29, 1999, 3289-3291.*

* cited by examiner

*Primary Examiner*—Wayne Langel
(74) *Attorney, Agent, or Firm*—Westerman, Hattori, Daniels & Adrian, LLP.

(57) ABSTRACT

The present invention provides a sp3-bonded boron nitride, represented by a general formula BN, having a hexagonal 5H or 6H polytypic form and having a property of emitting light in ultraviolet region. Its producing method comprises: introducing reaction mixed gas containing boron and nitrogen being diluted with dilution gas into a reaction chamber; and irradiating a surface of a substrate placed in the chamber, a growing surface on the substrate, and a growing spacing region about the growing surface with ultraviolet light to cause gas phase reaction, thereby generating, depositing, or growing the boron nitride on the substrate.

5 Claims, 6 Drawing Sheets

SP3 BOND BORON NITRIDE EMITTING LIGHT IN ULTRAVIOLET REGION, ITS PRODUCING METHOD, AND FUNCTIONAL MATERIAL USING SAME

TECHNICAL FIELD

The present invention relates to a sp3-bonded boron nitride, represented by a general formula "BN", and, more particularly, to a sp3-bonded boron nitride having a new crystalline structure having a hexagonal 5H or 6H polytypic form, a producing method of the same, and applications utilizing the properties of the same. That is, the present invention relates to a sp3-bonded boron nitride, represented by a general formula "BN", which has a hexagonal 5H or 6H polytypic form and a property of emitting light in ultraviolet region and which can be used as electronic materials, particularly light-emitting diode, ultraviolet solid-state laser, electron-emitting material, and surface coating material on cutting tool.

BACKGROUND OF THE INVENTION

Boron nitride is a material having been mainly used for industrial applications as heat resistant and abrasion-resistant materials. Recently, boron nitride has been also put as a subject of research as a part of research and development of boron compounds expected to develop new products and has received considerable attention.

Currently known sp3-bonded BNs are of cubic phase (3C polytypic form) and wurtzite form (2H polytypic form).

As a result that inventors of this invention have earnestly studied sp3-bonded boron nitride, represented by a general formula "BN", as a part of the aforementioned research, the inventors found a sp3-bonded boron nitride which has quite new crystalline structure and a very interesting, important, and specific property of emitting light in ultraviolet region. This invention was made on the basis of this finding. That is, the present invention provides a boron nitride having new crystalline structure, a producing method of the same, and applications of the same.

DISCLOSURE OF THE INVENTION

As a result of further earnest studies about sp3-bonded boron nitride, the inventors succeeded in providing a boron nitride having a novel structure and property, producing it with repeatability, and providing material to be used for new applications utilizing its specific properties according to technical features as described in the followings (1)-(12).

The implemented technical features are based on the requirements described in the following (1)-(12).

The technical feature of the first invention is to disclose the composition of the boron nitride having a novel structure and property which is the aim of the present invention.

That is, the first invention is (1) a sp3-bonded boron nitride, represented by a general formula BN, having a hexagonal 5H or 6H polytypic form and having a property of emitting light in ultraviolet region.

The technical features described in the second through eighth inventions are to disclose production methods of the boron nitride composition of the first invention.

That is, the second invention is (2) a producing method of a sp3-bonded boron nitride, represented by a general formula BN, having a hexagonal 5H or 6H polytypic form and having a property of emitting light in ultraviolet region, the method comprising: introducing reaction mixed gas containing boron and nitrogen being diluted with dilution gas into a reaction chamber; and irradiating a surface of a substrate placed in the chamber, a growing surface on the substrate, and a growing spacing region about the growing surface with ultraviolet light to cause gas phase reaction, thereby generating, depositing, or growing a sp3-bonded boron nitride, represented by a general formula BN, having a hexagonal 5H or 6H polytypic form and having a property of emitting light in ultraviolet region on the substrate.

The third invention is (3) a producing method of a sp3-bonded boron nitride, represented by a general formula BN, having a hexagonal 5H or 6H polytypic form and having a property of emitting light in ultraviolet region, as stated in the above (2), wherein the dilution gas is noble gas, hydrogen, nitrogen, or mixed gas consisting of two or more of these and the ratio of the reaction gas to the dilution gas is 100:0.0001-100% by volume.

The fourth invention is (4) a producing method of a sp3-bonded boron nitride, represented by a general formula BN, having a hexagonal 5H or 6H polytypic form and having a property of emitting light in ultraviolet region, the method comprising: inserting boron nitride as a boron raw material into a reaction chamber while introducing reaction mixed gas containing nitrogen being diluted with dilution gas into the reaction chamber; converging and emitting ultraviolet laser of from 190 nm to 400 nm wavelength onto the boron nitride solid raw material so as to vaporize, generate radical containing boron or BN precursor matter; and irradiating a surface of a substrate placed in the chamber, a growing surface on the substrate, and a growing spacing region about the growing surface with ultraviolet light to cause gas phase reaction between the reaction gas containing nitrogen and the radical containing boron or re-coagulation reaction of the BN precursor matter in the vaporized state, thereby generating, depositing, or growing a sp3-bonded boron nitride, represented by a general formula BN, having a hexagonal 5H or 6H polytypic form and having a property of emitting light in ultraviolet region on the substrate.

The fifth invention is (5) a producing method of a sp3-bonded boron nitride, represented by a general formula BN, having a hexagonal 5H or 6H polytypic form and having a property of emitting light in ultraviolet region, the method comprising: inserting boron nitride as a boron raw material into a reaction chamber while introducing reaction mixed gas containing boron and nitrogen being diluted with dilution gas into the reaction chamber; irradiating the boron nitride solid raw material with plasma as well as ultraviolet laser of from 190 nm to 400 nm wavelength so as to vaporize, generate radical containing boron or BN precursor matter; and irradiating a surface of a substrate placed in the chamber, a growing surface on the substrate, and a growing spacing region about the growing surface with ultraviolet light to cause gas phase reaction between the reaction gas containing nitrogen and the radical containing boron or re-coagulation reaction of the BN precursor matter in the vaporized state, thereby generating, depositing, or growing a sp3-bonded boron nitride, represented by a general formula BN, having a hexagonal 5H or 6H polytypic form and having a property of emitting light in ultraviolet region on the substrate.

The sixth invention is (6) a producing method of a sp3-bonded boron nitride, represented by a general formula BN, having a hexagonal 5H or 6H polytypic form and having a property of emitting light in ultraviolet region, as stated in the above (4) or (5), wherein the dilution gas is noble gas, hydrogen, nitrogen, or mixed gas consisting of two or more of these and the ratio of the reaction gas to the dilution gas is 100:0-100% by volume.

The seventh invention is (7) a producing method of a sp3-bonded boron nitride, represented by a general formula BN, having a hexagonal 5H or 6H polytypic form and having a property of emitting light in ultraviolet region, as stated in the above (4) or (5), wherein the ultraviolet laser is pulse laser.

The eighth invention is (8) a producing method of a sp3-bonded boron nitride, represented by a general formula BN, having a hexagonal 5H or 6H polytypic form and having a property of emitting light in ultraviolet region, as stated in the above (5) or (7), wherein by applying modulation synchronizing laser pulse onto the plasma, the plasma is packeted so as to generate, deposit, and grow a sp3-bonded boron nitride, represented by a general formula BN, having a hexagonal 5H or 6H polytypic form and having a property of emitting light in ultraviolet region and which has improved crystalline property.

The technical features in the ninth through twelfth inventions are described to disclose applications of the boron nitride composition of the first invention.

That is, the ninth invention is (9) a functional material containing a sp3-bonded boron nitride, represented by a general formula BN, having a hexagonal 5H or 6H polytypic form and having a property of emitting light in ultraviolet region as stated in the above (1), wherein the functional material is used for applications utilizing the properties of the boron nitride compound contained therein.

The tenth invention is (10) a functional material as stated in the above (9), wherein the functional material is used mainly as material emitting light in ultraviolet region.

The eleventh invention is (11) a functional material stated in the above (9), wherein the functional material is used mainly as an electronic material, particularly light-emitting diode.

The twelfth invention is (12) a functional material as stated in the above (9), wherein the functional material is used mainly as surface coating material on cutting tool.

The content described in the above (1) discloses a structure of a compound which is the aim of the present invention, that is, a sp3-bonded boron nitride, represented by a general formula BN, having a hexagonal 5H or 6H polytypic form and having a property of emitting light in ultraviolet region.

Currently known sp3-bonded BNs are of cubic phase (3C polytypic form) and wurtzite form (2H polytypic form), while the compound of the present invention according to the aforementioned structure has a hexagonal 5H or 6H polytypic form completely different from the conventionally known BNs and has a property of emitting light in ultraviolet region, as mentioned above.

Until now, no boron nitride emitting light in ultraviolet region (200-400 nm) has been known and no BN having a hexagonal 5H or 6H polytypic form and emitting light in ultraviolet region has been obtained. That is, the present invention provides a boron nitride having radically nobel structure and characteristics.

The features in the above (2) through (8) are described to disclose producing methods for the nobel boron nitride structured as described in (1), thereby producing the boron nitride with repeatability.

Figure 1:
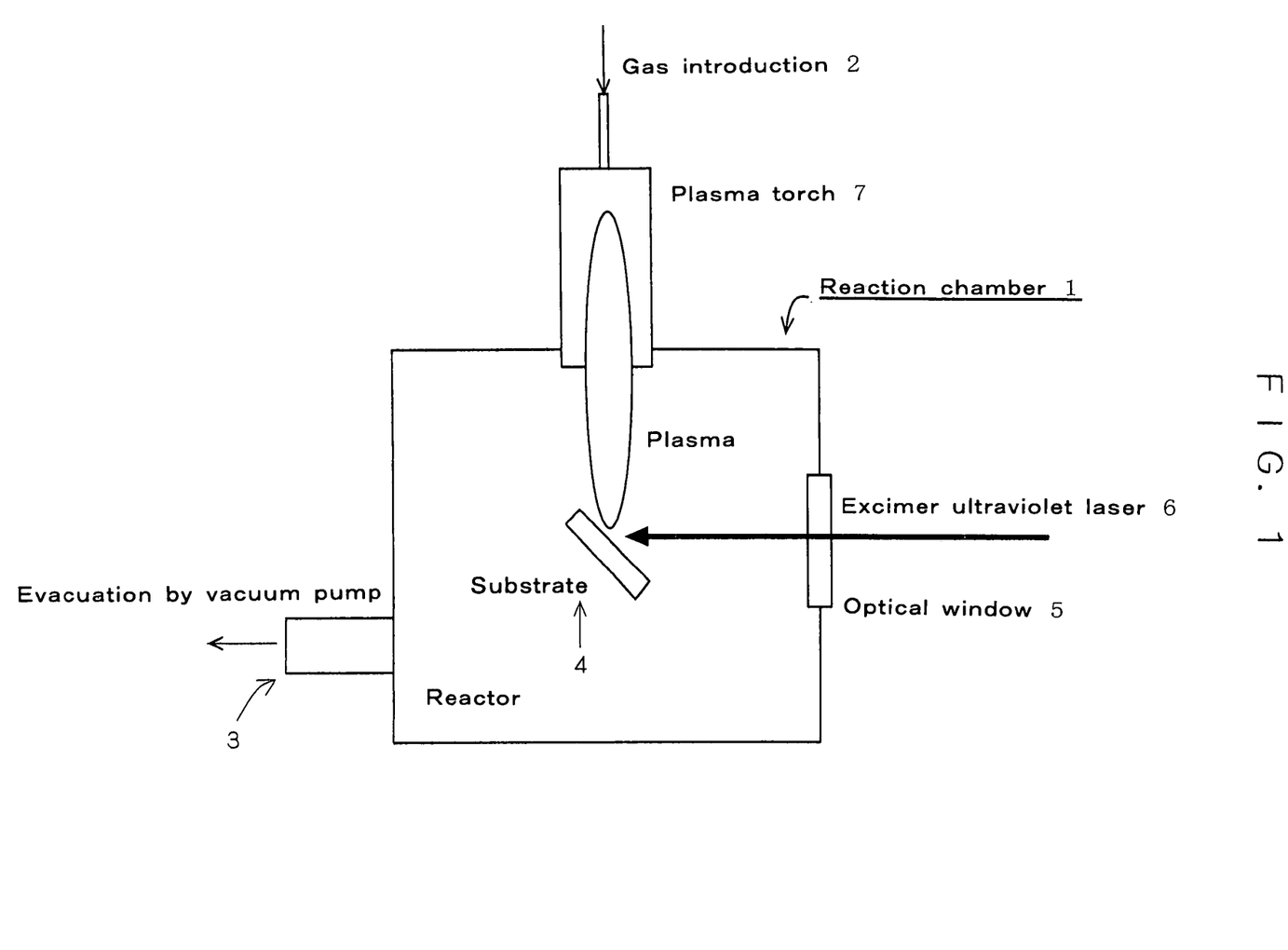
FIG. 1 is an illustration showing the outline of a synthesis reaction chamber of the present invention and a synthesis state.

The reaction chamber used herein is a CVD reaction chamber of which schematic structure is shown in FIG. 1. In FIG. 1, the reaction chamber 1 comprises a gas introduction port 2 for introduction of reaction gas and dilution gas therefore and a gas exhaust 3 for exhausting the introduced reaction gas and the like to the outside of the chamber and is connected to a vacuum pump so that the inner pressure is maintained at a reduced pressure below the atmospheric pressure. In the chamber, a boron nitride deposition substrate 4 is placed on the way of gas flow. An optical window 5 is mounted in a part of a wall of the reaction chamber facing the substrate. An excimer ultraviolet laser equipment 6 is set in such a manner that the substrate is irradiated with ultraviolet light through the window.

The reaction gas introduced into the reaction chamber is excited by the ultraviolet light incident on the substrate surface so as to cause gas phase reaction between nitrogen source and boron source in the reaction gas, thereby generating, depositing, or growing a sp3-bonded boron nitride, represented by a general formula BN, having a hexagonal 5H or 6H polytypic form and having a property of emitting light in ultraviolet region. It was apparent from experiments that the practical range of inner pressure of the reaction chamber is wide, i.e. from 0.001 to 760 Torr, and the practical range of temperature of the substrate is also wide, i.e. from room temperature to 1200° C. However, to obtain high-purity reaction product as desired compound, the reaction is preferably conducted with lower pressure and higher temperature.

Irradiating the substrate surface and a spacing range near the substrate with plasma as well as ultraviolet light for exciting the reaction gas is also practicable as another embodiment. In FIG. 1, a plasma torch 7 is provided for this embodiment. In this configuration, the reaction gas introduction port and the plasma torch are formed as united part facing the substrate so that the reaction gas and the plasma are directed to the substrate.

Figure 4:
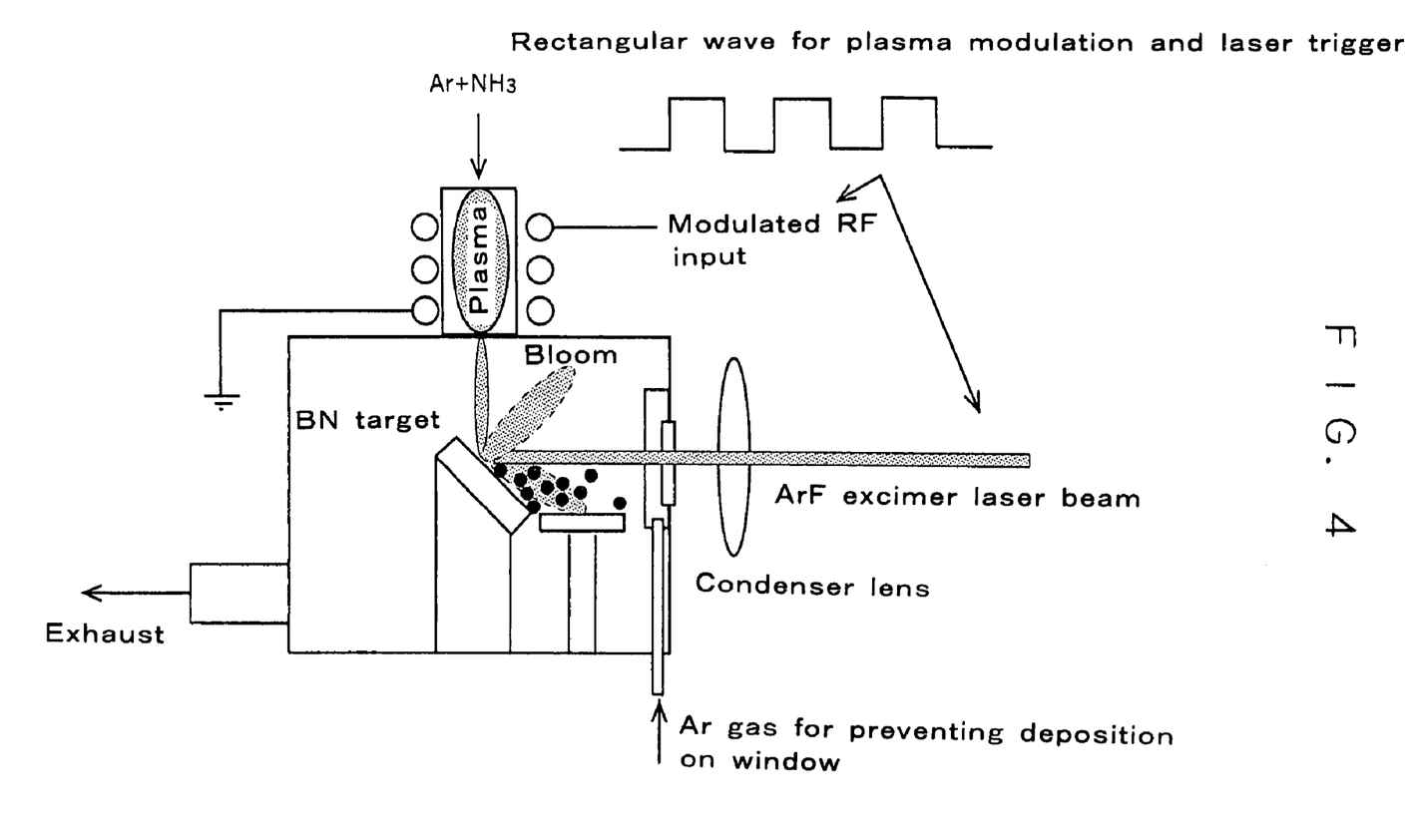
FIG. 4 is an illustration showing the outline of a synthesis reaction chamber of the present invention and a synthesis state using this chamber.

Though mixed gas containing nitrogen source and boron source can be used as the reaction material in the constitutions of the aforementioned inventions (2) through (8), the inventions described in (4) through (8) disclose the constitutions in case of using a boron nitride solid material as the boron source. FIG. 4 shows the aspect of the reaction in this case. That is, a BN target and a substrate are previously placed in the reaction chamber. Though the disclosed examples show embodiments in which only ammonia gas diluted with Ar gas is introduced as nitrogen source gas as the reaction gas into the reaction chamber through the plasma torch nozzle, embodiments are not limited thereto. That is, it is apparent to a person with ordinary skill in the art that, besides ammonia, gas containing nitrogen or other noble gas can be also used.

Anyway, the introduced gas is plasmarized and is directed to the BN target. The target is irradiated with exima laser as well as the plasma whereby the target is vaporized its components so as to generate radials of nitrogen and boron or a BN series precursor matter. By the gas phase reaction of the generated radicals or the re-coagulation reaction of vaporized component, a desired compound, i.e. a sp3-bonded boron nitride, represented by a general formula "BN", having a hexagonal 5H or 6H polytypic form and having a property of emitting light in ultraviolet region, is deposited or grown on the substrate.

It was apparent similarly to the above invention (2) that the practical range of inner pressure of the reaction chamber is wide, i.e. from 0.001 to 760 Torr, and the practical range of temperature of the substrate is also wide, i.e. from room temperature to 1200° C. Reaction products are also attached to the optical window for irradiation of excimer laser fixed in the reaction chamber, reducing the transmission of laser beam and thus inhibiting the reaction for obtaining the desired compound. Therefore, it is important to take measures for preventing such deposition on the optical window and/or portions of wall of the chamber where deposition is disadvantageous. As a specific means, argon gas is sprayed onto the optical window so as to form a kind of air curtain.

In the embodiment using the boron nitride target, it was apparent from experiments that means of applying modulation synchronizing excimer laser onto the plasma to packet the plasma is effective in increasing the crystalline property of the desired compound. Invention (8) discloses this embodiment.

BRIEF DESCRIPTION OF THE DRAWINGS

FIGS. 6(*a*)-6(*c*) are an SEM image (FIG. 6(*a*)), a CL image (FIG. 6(*b*)), and a CL spectrum of a sp3-bonded BN of hexagonal 5H polytypic form (Example 7) of the present invention.

EEXPLANATION OF REFERENCES

1 Reaction chamber
2 Gas introduction port
3 Gas exhaust
4 Substrate for boron nitride deposition
5 Optical window
6 Excimer ultraviolet laser
7 Plasma torch

BEST MODE FOR CARRYING OUT THE INVENTION

The invention of this application has the aforementioned features and, hereinafter, examples will be described in detail with reference to attached drawings and tables. These disclosed examples are for the purpose of disclosure of aspects of the present invention and are not intended to limit the scope of the present invention. That is, the present invention aims to provide a sp3-bonded boron nitride, represented by a general formula "BN", having a hexagonal 5H or 6H polytypic form and a property of emitting light in ultraviolet region, a production method of the same, and applications utilizing the properties of the same, as mentioned above.

EXAMPLES

It should be noted that, especially for the producing method and applications, the following examples are only for the purpose of illustrating the present invention and the present invention should not be limited by these examples.

Example 1

Figure 2:
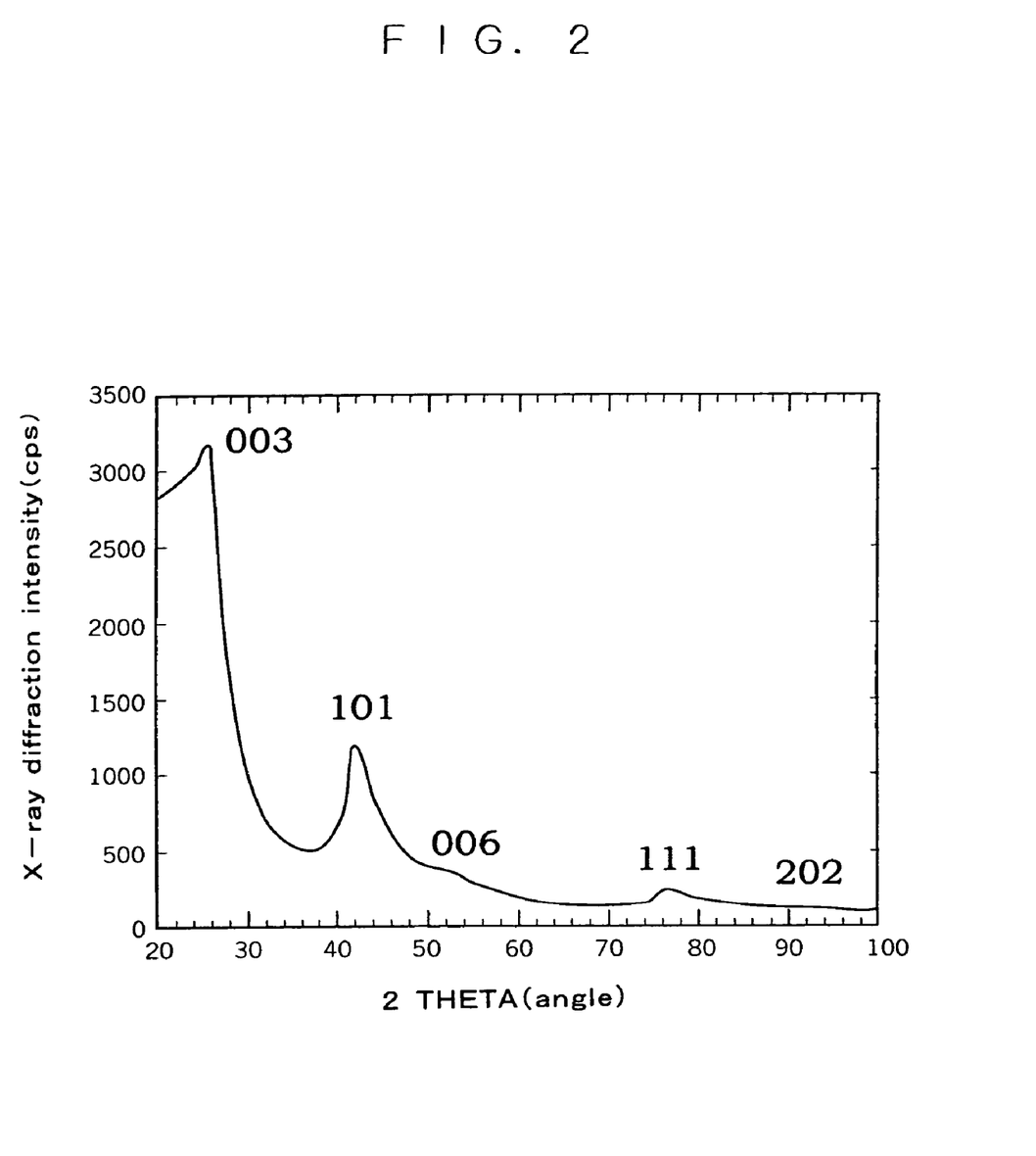
FIG. 2 is an X-ray diffraction pattern of a sp3-bonded BN of hexagonal 5H polytypic form (Example 1) of the present invention.

In atmosphere of a mixed diluted gas flow consisting of 3 SLM of argon flow and 100 sccm of hydrogen flow into which 5 sccm of diborane flow and 10 sccm of ammonia flow were introduced and, at the same time, which was evacuated by a pump to maintain the pressure at 20 Torr, a silicon substrate maintained at a temperature of 850° C. by heating was irradiated with excimer laser UV beams (see FIG. 1). After 90 minutes of synthesis, a desired compound was obtained. The crystalline system of this sample determined in the X-ray diffraction method was hexagonal, and this sample was sp3-bonded 5H polytypic form of which grating constant was a=2.53 Å, c=10.40 Å. The X-ray diffraction pattern is shown in FIG. 2. The diffraction results of this pattern are shown in Table 1.

TABLE 1

| h k l | Spacing/ theoretical value (Å) | Spacing/ actual measurement value (Å) | Error (%) | Peak intensity |
| --- | --- | --- | --- | --- |
| 0 0 3 | 3.4690 | 3.469 | 0.01 | Very intense |
| 0 0 6 | 1.7345 | 1.757 | −1.30 | Weak and broad |
| 1 0 1 | 2.1425 | 2.143 | 0.00 | Medium intense |
| 1 1 1 | 1.2548 | 1.244 | 0.87 | Relatively weak |
| 0 0 9 | 1.1563 | 1.1512 | 0.44 | Very weak and broad |
| 2 0 2 | 1.0712 | 1.0708 | 0.04 | Weak | a = −0.65% from the theoretical value
c = −0.30% from the theoretical value

Results of X-Ray Diffraction of the Sample of Example 1

Example 2

Figure 3:
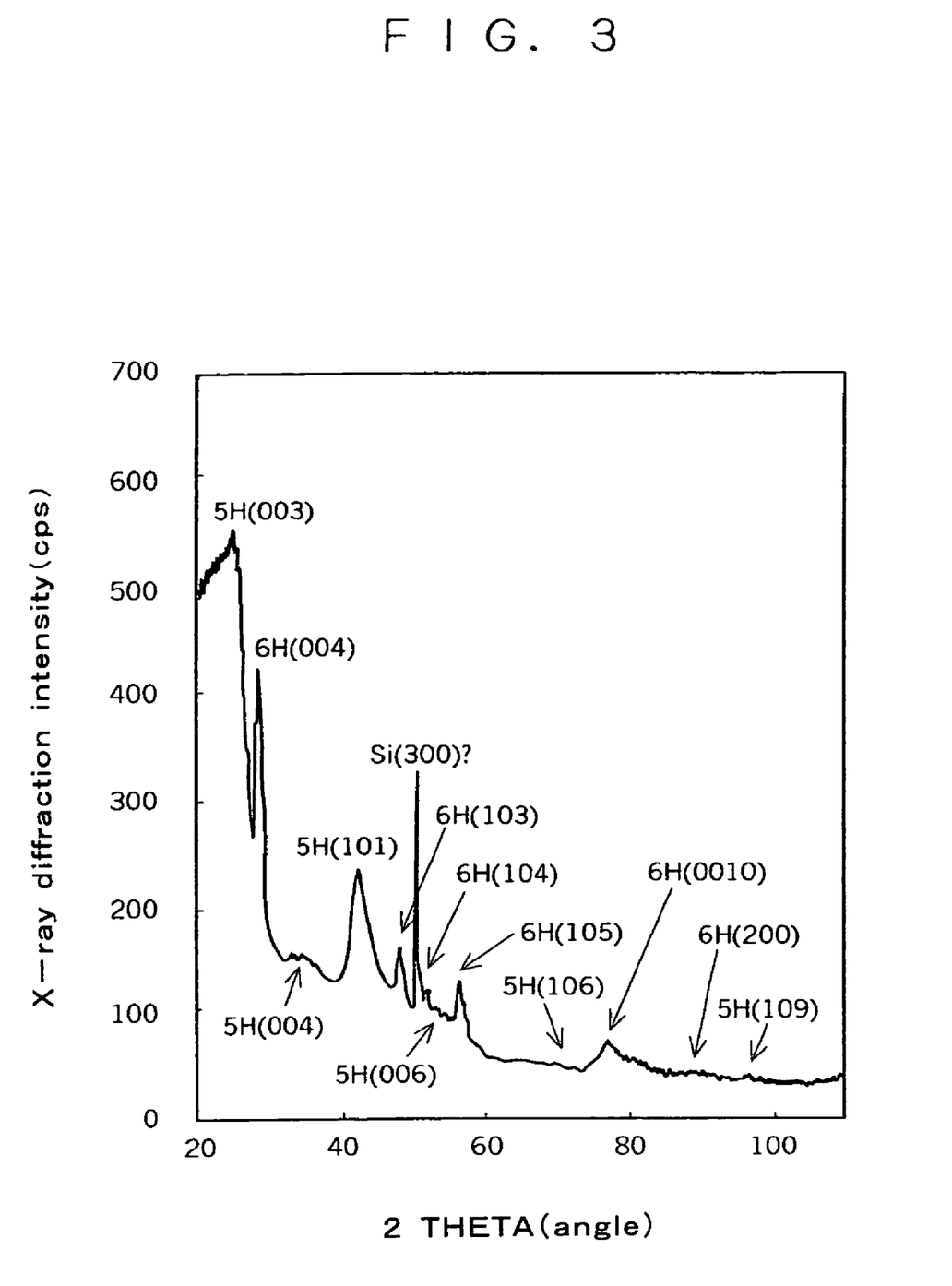
FIG. 3 is an X-ray diffraction pattern of a sp3-bonded BN of hexagonal 6H polytypic form (Example 2) of the present invention.

In atmosphere of a mixed diluted gas flow consisting of 2 SLM of argon and 100 sccm of hydrogen flow into which 10 sccm of diborane flow and 20 sccm of ammonia flow were introduced and, at the same time, which was evacuated by a pump to maintain the pressure at 20 Torr, a silicon substrate maintained at a temperature of 850° C. by heating was irradiated with excimer laser UV beams (see FIG. 1). After 90 minutes of synthesis, a desired compound was obtained. The crystalline system of this sample determined in the X-ray diffraction method was hexagonal, and this sample was sp3-bonded 5H polytypic form mixed with 6H polytypic form of which grating constant was a=2.5121 Å, c=12.4744 Å. The X-ray diffraction pattern is shown in FIG. 3. The diffraction results of this pattern are shown in Table 2.

TABLE 2

| sp3-bonded 6H—BN a = 2.5375 Å, c = 12.4744 Å | | | | |
| --- | --- | --- | --- | --- |
| h k l | Spacing/ theoretical value (Å) | Spacing/ actual measurement value (Å) | Error (%) | Peak intensity |
| 0 0 4 | 3.1186 | 3.1186 | 0.0000 | Very intense and sharp |
| 0 0 7 | 1.7821 | 1.7730 | 0.5082 | Weak |
| 0 0 10 | 1.2474 | 1.2404 | 0.5644 | Medium intense and broad |
| 1 0 5 | 1.6491 | 1.6397 | 0.5671 | Medium intense |
| 2 0 0 | 1.0988 | 1.0976 | 0.1065 | Weak | a = −0.65% from the theoretical value (2.5375)
c = −0.30% from the theoretical value (12.509)

Results of X-Ray Diffraction of the Sample of
Example 2

Example 3

In atmosphere of a mixed diluted gas flow consisting of 3 SLM of argon flow and 100 sccm of hydrogen flow into which 5 sccm of diborane flow and 10 sccm of ammonia flow were introduced and, at the same time, which was evacuated by a pump to maintain the pressure at 20 Torr, RF plasma of 600w output and of 13.56 MHz frequency rate was generated and a silicon substrate maintained at a temperature of 850° C. by heating was irradiated with excimer laser UV beams (see FIG. 1).

After 90 minutes of synthesis, a desired compound was obtained. The crystalline system of this sample was hexagonal, and this sample was sp3-bonded 5H polytypic form of which grating constant was a=2.507 Å, c=10.4145 Å.

Example 4

In atmosphere of a mixed diluted gas flow consisting of 2 SLM of argon flow and 50 sccm of hydrogen flow into which 5 sccm of diborane flow and 10 sccm of ammonia flow were introduced and, at the same time, which was evacuated by a pump to maintain the pressure at 20 Torr, RF plasma of 600w output and of 13.56 MHz frequency rate was generated and a silicon substrate maintained at a temperature of 850° C. by heating was irradiated with excimer laser UV beams (see FIG. 1).

After 90 minutes of synthesis, a desired compound was obtained. The crystalline system of this sample was hexagonal, and this sample was sp3-bonded 6H polytypic form of which grating constant was a=2.512 Å, c=12.474 Å.

Example 5

Figure 5:
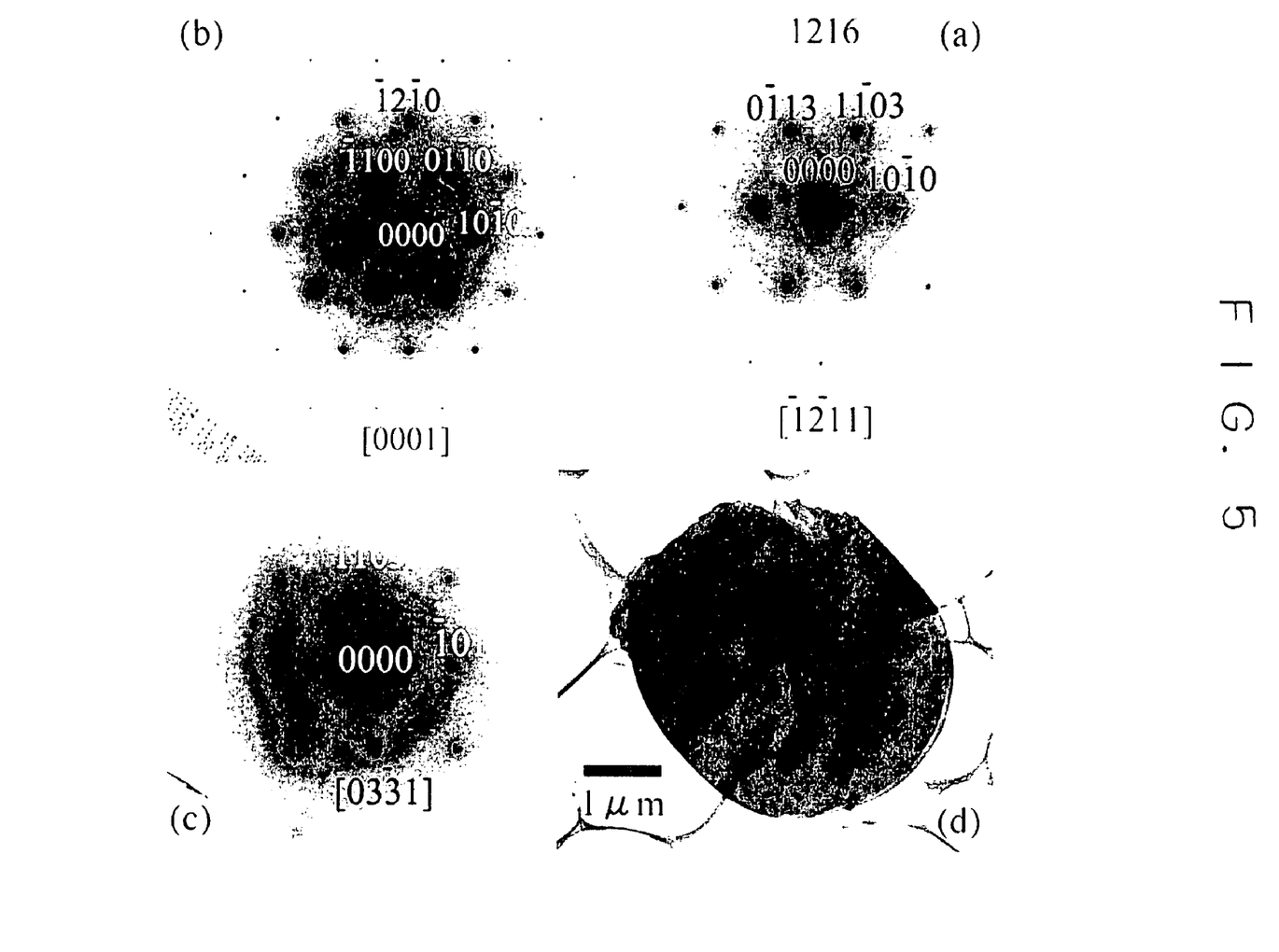
FIG. 5 is an electron diffraction pattern of a sp3-bonded BN of hexagonal 5H polytypic form (Example 5) of the present invention.

In atmosphere into which 2 SLM of argon flow and 1 sccm of ammonia flow were introduced and, at the same time, which was evacuated by a pump to maintain the pressure at 10 Torr, a precursor matter was produced by converging and emitting UV pulse laser of 193 nm wavelength onto a boron nitride material solid surface, i.e. by laser ablation, while the boron nitride solid surface was irradiated with plasma generated from a plasma generator provided in the reaction chamber at the same time (FIG. 4). During this, by applying modulation (duty ratio 50%) synchronizing laser pulse (20 Hz) onto the plasma, the plasma is packeted so as to have chemical and physical effects on growth of the precursor matter, thereby facilitating the improvement of crystalline property. After 90 minutes of synthesis, a desired compound was obtained. The crystalline system of this sample was hexagonal, and this sample was sp3-bonded 5H polytypic form of which grating constant was a=2.507 Å, c=10.41 Å. The electron diffraction patterns of the obtained sample are shown in FIGS. 5(*a*)-5(*c*) and the diffraction results of these patterns are shown in Table 3 and Table 4.

TABLE 3

| | H K I L | Spacing/ theoretical value (Å) | Spacing/ actual measurement value (Å) | Error (%) |
|---|---|---|---|---|
| FIG. 5(a) | 1 -2 1 6 | 1.022 | 1.010 | -1.113 |
| | 2 -2 0 6 | 0.926 | 0.917 | -0.948 |

TABLE 3-continued

| | H K I L | Spacing/ theoretical value (Å) | Spacing/ actual measurement value (Å) | Error (%) |
|---|---|---|---|---|
| | 2 0 -2 0 | 1.095 | 1.095 | 0.055 |
| | 2 -1 -1 3 | 1.188 | 1.181 | -0.525 |
| | -1 -1 2 3 | 1.188 | 1.191 | 0.243 |
| FIG. 5(b) | 0 3 -3 0 | 0.730 | 0.730 | -0.037 |
| | 3 0 -3 0 | 0.730 | 0.734 | 0.518 |
| | -3 3 0 0 | 0.730 | 0.733 | 0.379 |
| | -1 3 -2 0 | 0.827 | 0.826 | -0.209 |
| | -2 3 -1 0 | 0.827 | 0.826 | -0.209 |
| | -3 2 1 0 | 0.827 | 0.827 | -0.086 |
| FIG. 5(c) | 1 -1 0 3 | 1.851 | 1.852 | 0.037 |

Table 3 Results of Electron Diffraction of FIGS. 5(*a*)-5(*c*) (Spacing)

TABLE 4

| Pattern | h1 k1 l1 h3 k2 l2 | theoretical value (degrees) | actual measurement value (degrees) |
|---|---|---|---|
| FIG. 5(a) | 1 -2 6 1 -1 3 | 25.01 | 24.79 |
| FIG. 5(a) | 1 -1 3 1 0 0 | 64.99 | 65.14 |
| FIG. 5(b) | -1 1 0 0 1 0 | 60.00 | 60.14 |
| FIG. 5(b) | -1 1 0 1 0 0 | 120.00 | 120.09 |
| FIG. 5(c) | 1 -1 3 0 -1 6 | 47.09 | 47.15 |
| FIG. 5(c) | 1 -1 3 -1 0 3 | 94.17 | 93.09 |

Table 4 Results of Electron Diffraction of FIGS. 5(*a*)-5(*c*) (Space Angle)

Example 6

In atmosphere into which 2 SLM of argon flow and 1 sccm of ammonia flow were introduced and, at the same time, which was evacuated by a pump to maintain the pressure at 10 Torr, a precursor matter was produced by converging and emitting UV pulse laser of 193 nm wavelength onto a boron nitride material solid surface, i.e. by laser ablation, while the boron nitride solid surface was irradiated with plasma generated from a plasma generator provided in the reaction chamber at the same time (FIG. 4). During this, by applying modulation (duty ratio 50%) synchronizing laser pulse (20 Hz) onto the plasma, the plasma is packeted so as to have chemical and physical effects on growth of the precursor matter, thereby facilitating the improvement of crystalline property. After 90 minutes of synthesis, a desired comopund was obtained. The crystalline system of this sample was hexagonal, and this sample was sp3-bonded 6H polytypic form of which grating constant was a=2.511 Å, c=12.47 Å.

Example 7

In atmosphere into which 2 SLM of argon flow and 1 sccm of ammonia flow were introduced and, at the same time, which was evacuated by a pump to maintain the pressure at 10 Torr, a precursor matter was produced by converging and emitting UV pulse laser of 193 nm wavelength onto a boron nitride material solid surface, i.e. by laser ablation, while the boron nitride solid surface was irradiated with plasma generated from a plasma generator provided in the reaction chamber at the same time (FIG. 4). During this, by applying modulation (duty ratio 50%) synchronizing laser pulse (20 Hz) onto the plasma, the plasma is packeted so as to have chemical and physical effects on growth of the precursor matter, thereby facilitating the improvement of crystalline property.

After 90 minutes of synthesis, a desired compound was obtained. The crystalline system of this sample was hexagonal, and this sample was sp3-bonded 5H polytypic form of which grating constant was a=2.507 Å, c=10.41 Å. The scanning electron microscope image of this sample is shown in FIG. 6(a).

Figure 6:
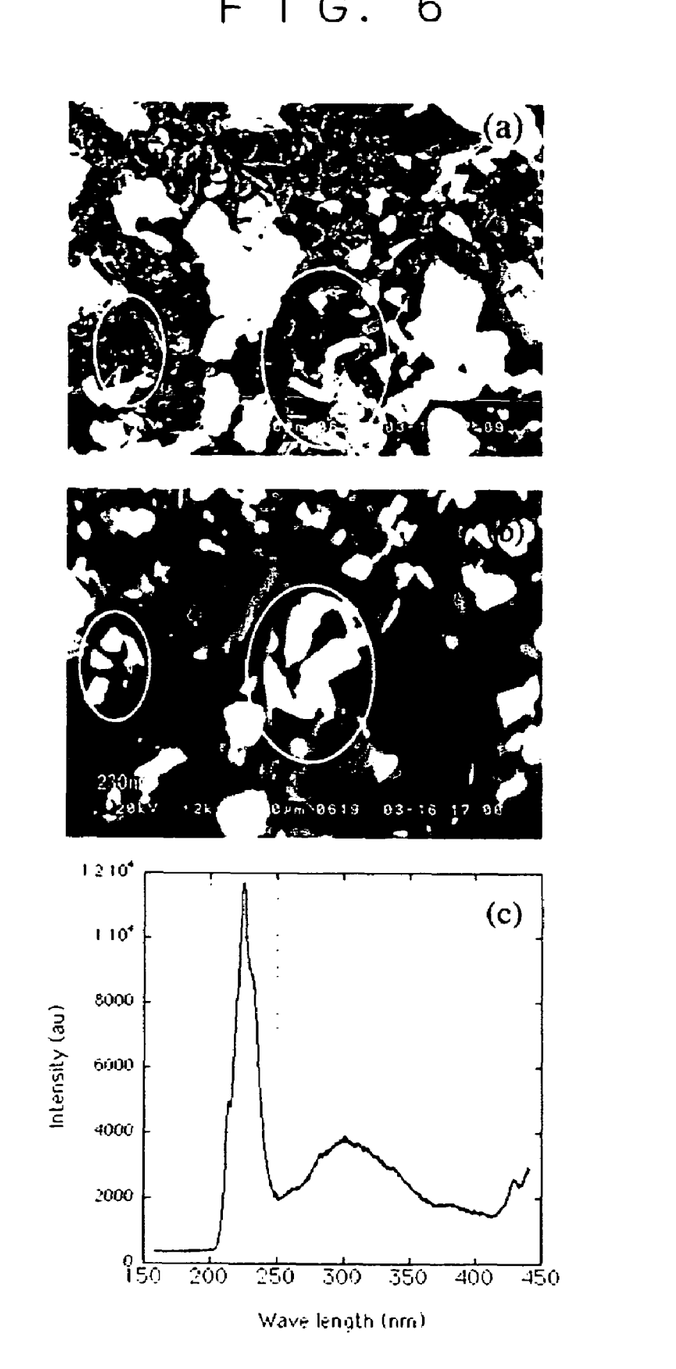

FIG. 6(b) is an image of cathode luminescence caused by irradiation of electron beam of 20KeV, the cathode luminescence image at 230 nm being taken. It is found that UV emission appears over the entire area of the sample. FIG. 6(c) shows a spectrum obtained from the cathode luminescence caused by irradiation of electron beam of 20KeV. It is found that there is sharp luminescence at 225 nm. It is found that there is broad UV emission is present at 300 nm.

INDUSTRIAL APPLICABILITY

Since a sp3-bonded hexagonal BN of 5H or 6H type has sharp emission at ultraviolet wavelength of 225 nm which is in a range capable of being used in atmosphere but almost borders on a region of vacuum ultraviolet, the BN has great potential as materials for practical application of solid ultraviolet laser. The practical application of solid ultraviolet laser will make immeasurable technical spillover effects on dramatic increase in capacity of rewritable recording media, chemistry, medicine, electronics industry, and others.

We claim:

1. A producing method of a sp3-bonded boron nitride, represented by a general formula BN, having a hexagonal 5H or 6H polytypic form and having a property of emitting light in ultraviolet region, the method comprising: inserting boron nitride as a boron nitride solid raw material into a reaction chamber while introducing reaction mixed gas containing nitrogen being diluted with dilution gas into the reaction chamber; converging and emitting ultraviolet laser of from 190 nm to 400 nm wavelength onto the boron nitride solid raw material so as to vaporize, generate radical containing boron or BN precursor matter; and irradiating a surface of a substrate placed in the chamber, a growing surface on the substrate, and a growing spacing region about the growing surface with ultraviolet light to cause gas phase reaction between the reaction mixed gas containing nitrogen and the radical containing boron or re-coagulation reaction of the BN precursor matter in the vaporized state, thereby generating, depositing, or growing a sp3-bonded boron nitride, represented by a general formula BN, having a hexagonal 5H or 6H polytypic form and having a property of emitting light in ultraviolet region on the substrate.

2. A producing method of a sp3-bonded boron nitride, represented by a general formula BN, having a hexagonal 5H or 6H polytypic form and having a property of emitting light in ultraviolet region, the method comprising: inserting boron nitride as a boron nitride solid raw material into a reaction chamber while introducing reaction mixed gas containing boron and nitrogen being diluted with dilution gas into the reaction chamber; irradiating the boron nitride solid raw material with plasma as well as ultraviolet laser of from 190 nm to 400 rim wavelength so as to vaporize, generate radical containing boron or BN precursor matter; and irradiating a surface of a substrate placed in the chamber, a growing surface on the substrate, and a growing spacing region about the growing surface with ultraviolet light to cause gas phase reaction between the reaction mixed gas containing nitrogen and the radical containing boron or re-coagulation reaction of the BN precursor matter in the vaporized state, thereby generating, depositing, or growing a sp3-bonded boron nitride, represented by a general formula BN, having a hexagonal 5H or 6H polytypic form and having a property of emitting light in ultraviolet region on the substrate.

3. A producing method of a sp3-bonded boron nitride, represented by a general formula BN, having a hexagonal 5H or 6H polytypic form and having a property of emitting light in ultraviolet region, as claimed in claim 1 or 2, wherein the dilution gas is noble gas, hydrogen, nitrogen, or mixed gas consisting of two or more of these and the ratio of the reaction mixed gas to the dilution gas is 100:0-100% by volume.

4. A producing method of a sp3-bonded boron nitride, represented by a general formula BN, having a hexagonal 5H or 6H polytypic form and having a property of emitting light in ultraviolet region, as claimed in claim 1 or 2, wherein the ultraviolet laser is pulse laser.

5. A producing method of a sp3-bonded boron nitride, represented by a general formula BN, having a hexagonal 5H or 6H polytypic form and having a property of emitting light in ultraviolet region, as claimed in claim 2, wherein by applying modulation synchronizing laser pulse onto the plasma, the plasma is packeted so as to generate, deposit, and grow a sp3-bonded boron nitride, represented by a general formula BN, having a hexagonal 5H or 6H polytypic form and having a property of emitting light in ultraviolet region and which has improved crystalline property.

* * * * *